United States Patent
Kempen et al.

(10) Patent No.: US 6,201,912 B1
(45) Date of Patent: Mar. 13, 2001

(54) BIREFRINGENT FIBER GRATING SENSOR AND DETECTION SYSTEM

(75) Inventors: Lothar U. Kempen, Redondo Beach; John D. Prohaska; Robert A. Lieberman, both of Torrance, all of CA (US)

(73) Assignee: Physical Optics Corporation, Torrance, CA (US)

( * ) Notice: Subject to any disclaimer, the term of this patent is extended or adjusted under 35 U.S.C. 154(b) by 0 days.

(21) Appl. No.: 09/434,225

(22) Filed: Nov. 5, 1999

Related U.S. Application Data (62) Division of application No. 09/057,067, filed on Apr. 8, 1998.

(51) Int. Cl.$^7$ ............................................... G02B 6/34
(52) U.S. Cl. ............................ 385/37; 359/326; 356/351; 385/12
(58) Field of Search ........................... 359/326; 356/351; 385/37, 12

(56) References Cited

U.S. PATENT DOCUMENTS

| | | | |
|---|---|---|---|
| 5,383,207 | * | 1/1995 | Culverhouse et al. .................. 372/28 |
| 5,523,839 | * | 6/1996 | Robinson et al. .................... 356/349 |
| 5,841,131 | * | 11/1998 | Shcroeder et al. .............. 250/227.17 |
| 5,920,414 | * | 7/1999 | Miyachi et al. ..................... 359/133 |

OTHER PUBLICATIONS

Xin et al., "Heterodyne Optical Beat Interference Limitations on Wavelength Division Multiplexed Networks", 1995 Digest of the LEOS Summer Topical Meetings, pp. 68–69.*

* cited by examiner

*Primary Examiner*—John D. Lee
*Assistant Examiner*—Michelle R. Connelly-Cushwa
(74) *Attorney, Agent, or Firm*—Nilles & Nilles, S.C.

(57) ABSTRACT

A sensor system comprises a broadband light source, a birefringent sensor, a detection circuit, and a signal processing unit. The preferred detection circuit further includes a variable frequency oscillator, a modulator, and a photodetector. The modulator modulates the output of the birefringent sensor with a modulation signal from the variable frequency oscillator. The modulation produces an interference signal having a variable interference frequency. By determining the frequency of the modulation signal from the variable frequency oscillator that minimizes the interference frequency, the detection system is able to determine the difference in frequency between first and second spectral components of the output of birefringent sensor. The detector may be constructed using entirely solid state optics/electronics. The preferred fiber grating sensor comprises a birefringent optical fiber having a cladding and a core. The cladding has first and second side holes formed therein that extend substantially parallel to the core, and that are substantially coextensively located with respect to each other along the length of the optical fiber. The first and second side holes are preferable positioned such that, in transverse cross section of the optical fiber, a first radial line that extends from the core to the first side hole is substantially perpendicular to a second radial line that extends from the core to the second side hole.

22 Claims, 7 Drawing Sheets

BIREFRINGENT FIBER GRATING SENSOR AND DETECTION SYSTEM

This application is a divisional of U.S. Ser. No. 09/057,067 filed Apr. 8, 1998, pending.

BACKGROUND OF THE INVENTION

1. Field of the Invention

The present invention relates to birefringent fiber grating sensor systems and methods. In particular, the present invention relates to a birefringent fiber grating sensor system having a fiber grating sensor formed of an optical fiber with a plurality of side holes. In another embodiment, the present invention relates to a detection circuit for a birefringent fiber grating sensor system.

2. Description of the Invention

Various types of fiber optic sensor systems are known. In such systems, a tranducer mechanism is used that affects the properties of light in an optical fiber in a manner that can be detected and that is indicative of a sensed parameter.

One example of such a transducer mechanism is a fiber grating sensor formed of a Bragg fiber grating recorded in a birefringent fiber. A Bragg grating comprises a periodic or semi-periodic refractive index structure recorded of an optical fiber. In the refractive index structure, the effective index of refraction is varied at a given spatial period (defined by a grating constant $\Lambda$) along the length of the optical fiber. At a particular wavelength of the light, the period of the refractive index structure corresponds to the wavelength of the light guided in the optical fiber. Consequently, a resonance condition which is thereby created causes the light to reflect backwards. This resonance condition is known as the Bragg condition, and is stated mathematically as follows:

$$\lambda_B = 2n_{eff}\Lambda \quad (1)$$

where $\lambda_B$ is the wavelength of light that is reflected backwards, nff is the effective index of refraction of the propagating mode, and $\Lambda$ is the grating constant or period of the Bragg grating. In practice, real world constraints prevent the Bragg grating from being reflective only at the infinitesimally narrow spectral region defined by the discrete wavelength $\lambda_B$. Instead, the Bragg grating is reflective in a narrow-banded spectral region that is centered about the wavelength $\lambda_B$. Mathematically, however, the narrow-banded spectral region can be modeled as occurring at the discrete wavelength $\lambda_B$. This simplification works quite well, and is utilized throughout the discussion contained herein.

In a birefringent fiber, light of one polarization experiences a different effective index of refraction than light of an orthogonal polarization. Thus, with reference to Eq. (1), it is seen that a Bragg grating recorded in a birefringent fiber reflects light at two different wavelengths.

This arrangement has been used to implement a pressure sensor. When pressure is applied to the pressure sensor, there is a change in the birefringence of the optical fiber and therefore a change in the spectral separation between the two wavelengths that are reflected. The change in separation of the two wavelengths is proportional to the amount of pressure applied. Thus, by monitoring the separation between the two wavelengths that are reflected, an indication of the pressure applied to the pressure sensor is obtained.

Fiber optic sensors enjoy popularity because they have several advantages over other types of sensors. First, because fiber optic sensors are non-conductive, they are particularly safe in applications where spark-induced fires or explosions are a concern. Additionally, for the same reason, fiber optic sensors are generally immune to lightning strikes and other sources of electromagnetic pulses or interference. Finally, fiber optic sensors, and in particular fiber grating sensors, can be fabricated in the optical fiber itself. Such fiber optic sensors are particularly easy to combine in wavelength-division multiplexed and/or time-division multiplexed fashion by disposing the sensors at various locations along an optical fiber.

However, several difficulties have been encountered in conjunction with fiber optic sensors systems, and more specifically in conjunction with birefringent fiber grating sensor systems. First, existing birefringent sensor systems do not exhibit satisfactory sensitivity. The change in birefringence of a birefringent sensor is in part caused by the geometrical asymmetry that occurs when the optical fiber deforms under strain. However, being made of glass, optical fibers are relatively difficult to deform and sensitivity is thereby limited. Moreover, traditional birefringent sensor systems have used detection techniques with limited sensitivity. Thus, what is needed is a fiber grating sensor arrangement that is more sensitive to sensed parameters such as pressure.

Second, existing birefringent sensor systems utilize sensor arrangements that are of limited flexibility. For example, in the context of pressure sensors, many existing fiber grating sensor arrangements are unable to measure differential pressure. Additionally, many existing fiber grating sensor arrangements do not provide temperature compensation. Thus, what is also needed is a fiber grating sensor arrangement that exhibits improved flexibility.

Finally, existing birefringent sensor systems utilize bulky detection systems that are implemented with free space (non-solid state) optics. The detection system is used to determine the spectral separation of the two reflections. Existing detection systems employ high resolution spectrometer techniques, such as performing a Fourier analysis on the coherence function of the reflected light to determine the spectral characteristics of the reflected light. However, in order to obtain high resolution coherence measurements, existing detection systems utilize an interferometer implemented with free space (non-solid state) optics. Such interferometers tend to be quite bulky and must operate in a low vibration (preferably, vibration-free) environment. Thus, what is needed is a detection system that can be implemented entirely in solid state optics/electronics but that exhibits the same sensitivity as more bulky, free space optics-based detection systems.

BRIEF SUMMARY OF THE INVENTION

The present invention overcomes these drawbacks of the prior art. Specifically, in accordance with one aspect of the invention, the present invention provides a fiber grating sensor comprising a birefringent optical fiber having a cladding and a core. The cladding has first and second side holes formed therein that extend substantially parallel to the core, and that are substantially coextensively located with respect to each other along the length of the optical fiber. The first and second side holes are positioned such that, in transverse cross section of the optical fiber, a first radial line that extends from the core to the first side hole is non-parallel and non-coincident with a second radial line that extends from the core to the second side hole.

Preferably, additional side holes are formed in the cladding. Additionally, the cladding preferably is provided with one or more access holes that extend radially from one of the side holes to an exterior surface of the optical fiber. For example, in one preferred embodiment, two side holes are filled with fluid and two orthogonal side holes are filled with air. Four access holes are provided for the two side holes filled with fluid. The access holes permit fluid to flow through the sensor so that the sensor may be used to determine the pressure of the fluid. Advantageously, the provision of two air-filled side holes improves the sensitivity of the sensor.

In another preferred embodiment, two side holes are filled with fluid from a first supply of fluid, and two side holes are filled with fluid from a second supply of fluid. The sensor is then used to determine the differential pressure between the fluid from the first supply of fluid and the fluid from the second supply of fluid.

Advantageously, the sensor arrangement is very flexible, and may be used to measure other parameters instead of fluid pressure. For example, one or more side holes may be filled with a magneto-strictive material so that the parameter sensed by the sensor is the intensity of a magnetic field. As another example, one or more side holes may be filled with an electro-strictive material so that the parameter sensed by the sensor is the intensity of an electric field. As yet another example, one or more side holes may be filled with a material with a high thermal expansion coefficient so that the parameter sensed by the sensor is the temperature of the material. As yet another example, one or more side holes is filled with a material that deforms under the influence of a specific chemical substance so that the parameter sensed by the sensor is the presence of the specific chemical substance. In another preferred embodiment, one or more side holes is filled with a temperature compensating material that compensates for temperature fluctuations in the material that is in one or more of the remaining side holes.

In accordance with another aspect of the invention, the present invention provides a method of detecting a difference in frequency between first and second narrow-banded positive spectral components of an optical signal. According to the method, at least one of the first and second spectral components of the optical signal is modulated by a narrow-banded positive modulation spectral component of a modulation signal. The first and second spectral components of the optical signal are respectively centered about first and second frequencies. Similarly, the modulation spectral component of the modulation optical signal is centered about a modulation frequency. The modulation produces interference that has an interference frequency which is a function of the first and second frequencies and the modulation frequency. The modulation frequency is then varied, causing the interference frequency to vary. The variation of the interference frequency is then monitored and, based on this step, the difference in frequency between first and second spectral components is determined. In a preferred embodiment, the monitoring step comprises the step of searching for a value of the modulation frequency that minimizes the interference frequency.

Advantageously, the detection method according to the present invention may be implemented using entirely solid state optics/electronics. An interferometer implemented using free space optics is not required. This permits a detection system according to the present invention to be constructed less expensively, more compactly, and in a manner that is more resistant to vibration as compared to existing detection systems. Moreover, these benefits are achieved without any loss in precision as compared to existing detection systems.

Other objects, features, and advantages of the present invention will become apparent to those skilled in the art from the following detailed description and accompanying drawings. It should be understood, however, that the detailed description and specific examples, while indicating preferred embodiments of the present invention, are given by way of illustration and not limitation. Many modifications and changes within the scope of the present invention may be made without departing from the spirit thereof, and the invention includes all such modifications.

BRIEF DESCRIPTION OF THE DRAWINGS

A preferred exemplary embodiment of the invention is illustrated in the accompanying drawings in which like reference numerals represent like parts throughout, and in which.

DETAILED DESCRIPTION OF THE PREFERRED EMBODIMENTS

1. System Overview

Figure 1:
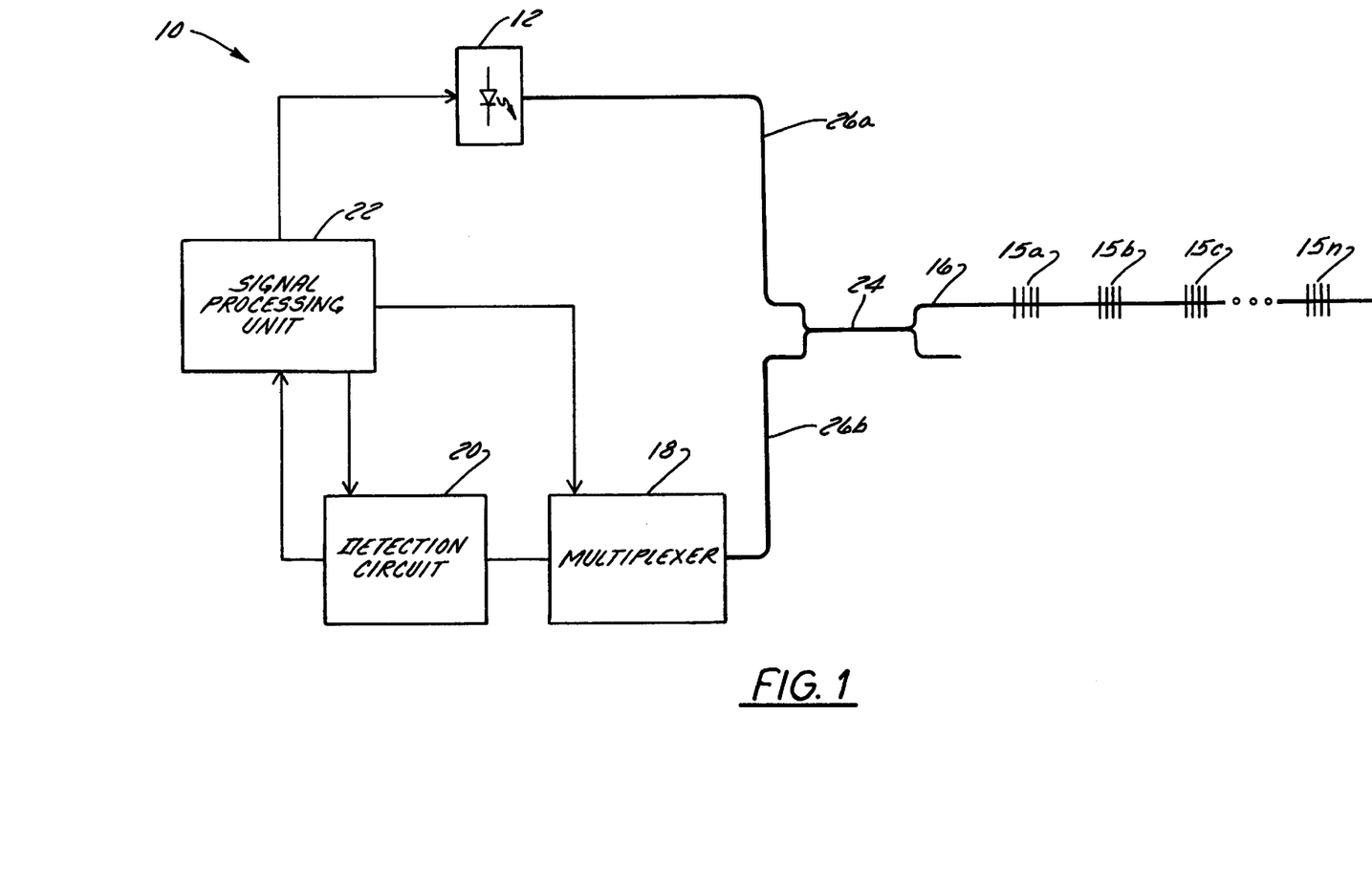
FIG. 1 is a schematic diagram of a birefringent sensor system according to one embodiment of the present invention.

Referring now to FIG. 1, a schematic diagram of a birefringent sensor system 10 is illustrated. By way of overview, the system 10 comprises an illumination source 12, a network of sensors 15a–15n disposed along an optical fiber 16, a multiplexer 18, a detection circuit 20, and a signal processing unit 22. The signal processing unit 22 could be, for example, a digital signal processor, an analog signal processor, a computer, or any other suitable signal processing unit. The sensors 15a–15n are optically coupled to the illumination source 12 by way of a non-dispersive coupler 24 and an optical fiber 26a. The sensors 15a–15n are optically coupled to the detection circuit 20 by way of the non-dispersive coupler 24 and an optical fiber 26b. The system 10 is referred to as a multi-point sensing system because it comprises the multiple sensors 15a–15n that are all disposed at different locations along the common optical fiber 16.

In operation, the illumination source 12 emits light that is transmitted though the optical fiber 26a, through the non-dispersive coupler 24, and to the optical fiber 16. Each sensor reflects only a small portion of the light that it receives and transmits the rest to the remaining sensors further down the optical fiber 16. The system 10 is preferably a wavelength-division multiplexed system, such that the sensors 15a–15n are all tuned to different wavelengths (i.e., the grating constant Λ is different for each of the sensors 15a–15n). Therefore, the different sensors 15a–15n reflect different wavelengths depending on the grating constant Λ for the particular sensor. The sensors 15a–15n could be used to measure any one of a variety of different parameters, such as fluid pressure, electric field intensity, magnetic field intensity, temperature, and so on. The construction of various preferred embodiments of the sensors 15a–15n is described in greater detail below in conjunction with FIGS. 2A–2B, 3A–3C and 4.

The light reflected from the sensors 15a–15n is reflected back through the optical fiber 16 to the non-dispersive coupler 24. The coupler 24 transmits half of the light through the optical fiber 26a (this half of the light being lost), and the other half of the light through the optical fiber 26b to the multiplexer 18. In the preferred embodiment, the multiplexer 18 comprises a wavelength division multiplexer (not illustrated) in series with a time division multiplexer (not illustrated). The wavelength division multiplexer is coupled to the optical fiber 26b and associates each pair of reflections with a particular sensor on the basis of the wavelength of the reflection and stored information pertaining to the tuned wavelength of the sensors 15a–15n. The wavelength division multiplexer has a plurality of outputs that each correspond to a respective one of the sensors 15a–15n and that are connected to inputs of the time division multiplexer. The time division multiplexer sequentially selects the outputs of the wavelength division multiplexer. The output of the time division multiplexer is connected to the detection circuit 20. This arrangement allows the sensors 15a–15n to be disposed along a common optical fiber while at the same time permitting the optical signals from the sensors 15a–15n to be processed sequentially, so that only a single detection circuit 20 is required.

After receiving the output signal of a selected one of the sensors 15a–15n, the detection circuit 20 determines the spectral separation between the two reflections from the selected sensor in order to permit the signal processing unit 22 to determine the value of the sensed parameter (e.g., the amount of a pressure sensed by the selected sensor). The construction and operation of the preferred embodiment of the detection circuit 20 is described in greater detail below in conjunction with FIGS. 5, 6 and 7A–7D. Additionally, an alternative embodiment of the detection circuit 20 is described in conjunction with FIGS. 8 and 9.

2. Detailed Description of Preferred Sensor Arrangements

Figure 2A:
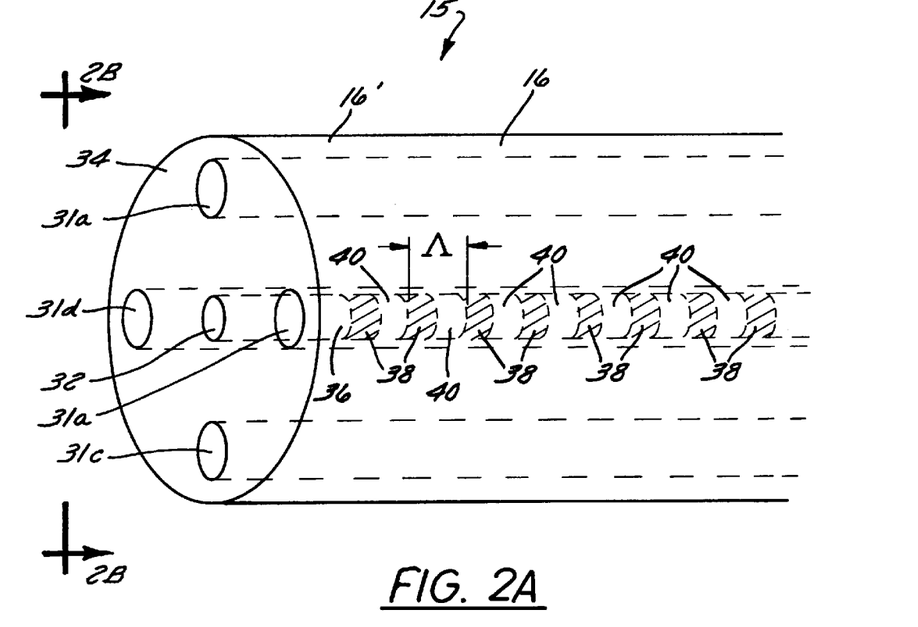
FIG. 2A is a perspective view of a preferred birefringent sensor for use in conjunction with the birefringent sensor system of FIG. 1.
Figure 2B:
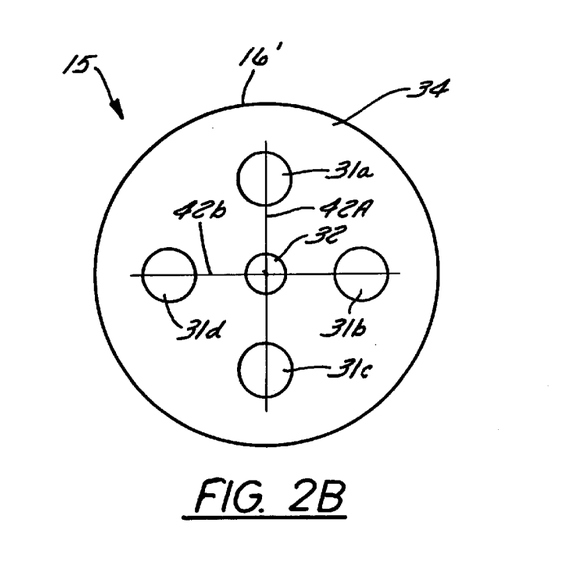
FIG. 2B is a cross sectional view taken along the lines 2B—2B in FIG. 2A.

Referring now to FIGS. 2A–2B, a sensor 15 is illustrated in greater detail. The sensor 15 is intended to generically represent each of the sensors 15a–15n. Accordingly, the description below pertains to all of the sensors 15a–15n.

The optical fiber 16 is a birefringent optical fiber and comprises a core 32 and a cladding 34. The core 32 has a fiber grating 36 recorded therein. (The longitudinal dimensions of refractive index regions 38 and 40 have been greatly exaggerated in FIG. 2A as compared to the thickness of the optical fiber 16 to show the fiber grating 36.) The fiber grating 36 is reflective at two wavelengths defined by the grating constant Λ and the effective index of refraction (including birefringent effects) as previously described in conjunction with Eq. (1), and is otherwise generally transmissive. The fact that the optical fiber 16 is birefringent maintains separation between the two reflections and prevents coupling between light from the two polarization modes.

The cladding 34 has a plurality of side holes 31a–31d formed therein. In practice, the side holes 31a–31d are formed in only a section 16' of the optical fiber 16 that is used to form the sensor 15. The side holes 31a–31d are drilled into the preform of the section 16' of the optical fiber 16 during manufacturing, before the section 16' of the optical fiber 16 is drawn down to its final thickness. The section 16' is then fusion spliced to the remainder of the optical fiber 16. In the preferred embodiment, four side holes are utilized. However, more or fewer side holes could also be utilized.

The side holes 31a–31d are substantially coextensively located with respect to each other along the length of the optical fiber 16. Additionally, the side holes 31a–31d extend substantially parallel to the core 32 and are preferably orthogonally positioned with respect to each other and with respect to the core 32. In other words, when the side holes 31a–31d and the core 32 are viewed in transverse cross section (FIG. 2B), a first line 42a that extends from the side hole 31a, through the core 32 to the side hole 31c is preferably substantially perpendicular to a second line 42b that extends from the side hole 31b through the core 32 to the side hole 31d. (The lines 42a and 42b are shown merely for purposes of illustration and do not form part of the optical fiber 16.) In general, the side holes 31a–31d could also be arranged such that the lines 42a and 42b are non-parallel and noncoincident without necessarily being substantially perpendicular, although the resultant sensor may not work as well.

The sensor 15 may be used to measure a variety of different parameters. For example, the sensor 15 may be used to measure (1) temperature (by placing a material with high thermal expansion properties in one or more of the side holes 31a–31d), (2) fluid pressure (by placing the fluid itself in one or more of the side holes 31a–31d), (3) electric field intensity (by placing an electro-strictive material, for example a piezo-electric material, which deforms under the influence of an electric field in one or more of the side holes 31a–31d), (4) magnetic field intensity (by placing a magneto-strictive material that deforms under the influence of a magnetic field in one or more of the side holes 31a–31d), or (5) the concentration of a specific chemical substance (by placing a material that deforms under the concentration of the specific chemical substance in one or more of the side holes 31a–31d). Other parameters could also be measured. Two specific examples of the construction and operation of the sensor 15 are now given in conjunction with FIGS. 3A, 3B, 3C and 4, in which the sensor 15 is used as a pressure sensor.

Figure 3A:
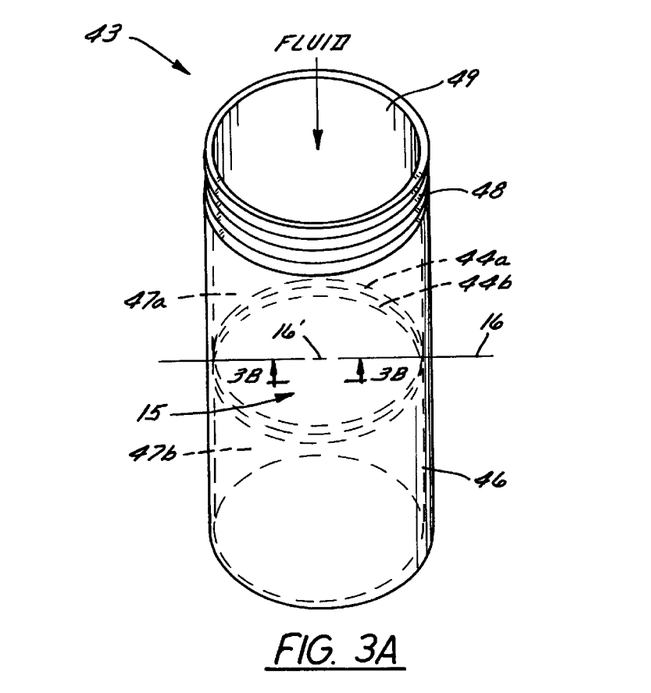
FIG. 3A is a perspective view of an arrangement that uses the birefringent sensor of FIGS. 2A–2B as a pressure sensor.
Figure 3B:
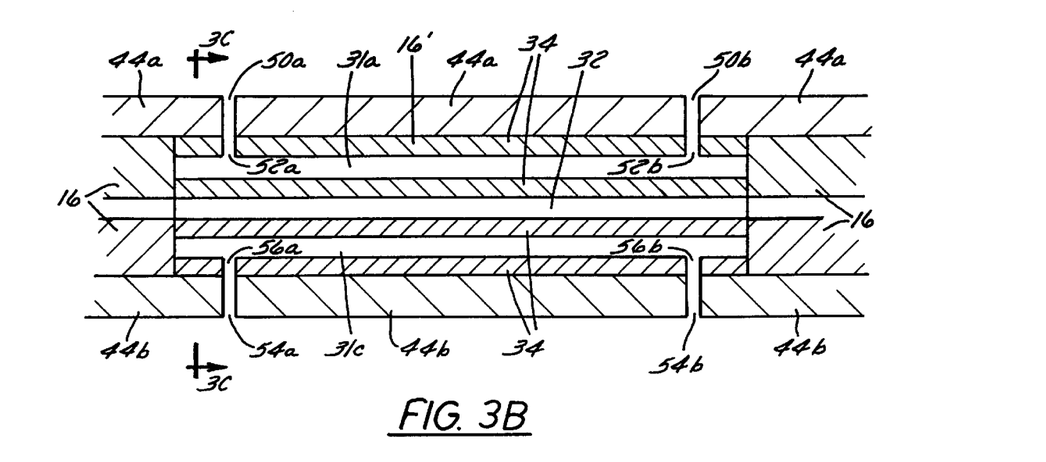
FIG. 3B is a cross sectional view taken along the lines 3B—3B in FIG. 3A.
Figure 3C:
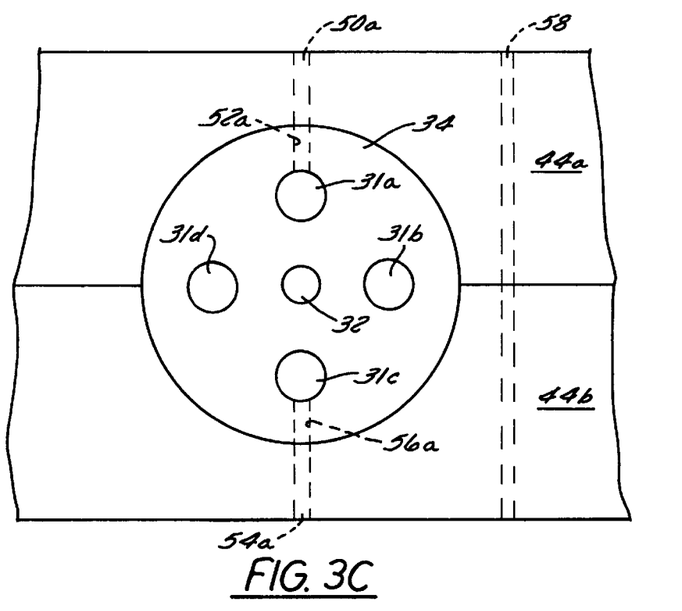
FIG. 3C is a cross sectional view taken along the lines 3C—3C in FIG. 3B.

Specifically, in FIGS. 3A–3C, the sensor 15 measures the pressure of a fluid with reference to, for example, a sealed volume of air. As shown in FIG. 3A, the arrangement comprises the sensor 15 and first and second disks 44a and 44b that are used to mount the sensor 15 within a pipe 46. The sensor 15, which is contained in the optical fiber 16, is disposed between the first and second disks 44a and 44b. The disks 44a and 44b divide the pipe into first and second regions 47a and 47b. The pipe 46 allows the sensor 15 to be mounted in conventional manner using threads 48 so as to provide the sensor 15 access to a fluid. The fluid, which may be a liquid or a gas, enters the pipe 46 through an opening 49 at one end of the pipe.

FIG. 3B illustrates a cross section view taken along the lines 3B—3B in FIG. 3A, and FIG. 3C illustrates a cross section view taken along the lines 3C—3C in FIG. 3B. As shown, the first disk 44a has first and second channels 50a and 50b, respectively, formed therein. The channels 50a and 50b are disposed between an exterior surface of the first disk 44a and an exterior surface of the optical fiber 16. The channels 50a and 50b are aligned with first and second access holes 52a and 52b that are formed in the cladding 34 of the fiber. The first and second access holes 52a and 52b extend from the exterior surface of the optical fiber 16 to the side hole 31a. The access holes 52a and 52b cooperate with the side hole 31a to provide a fluid channel in the cladding 34 through which fluid having a pressure can flow. Although it would be possible to use only a single access hole, the use of two access holes 52a and 52b is preferred because it prevents air from becoming trapped in the side hole 31a.

In similar fashion to the first disk 44a, the second disk 44b also has first and second channels 54a and 54b, respectively, formed therein. The channels 54a and 54b are disposed between an exterior surface of the second disk 44b and an exterior surface of the optical fiber 16. The channels 54a and 54b are aligned with first and second access holes 56a and 56b that are formed in the cladding 34 of the fiber. The first and second access holes 56a and 56b extend from the exterior surface of the optical fiber 16 to the side hole 31c. The access holes 56a and 56b cooperate with the side hole 31c to provide a fluid channel in the cladding 34 through which fluid having a pressure can flow.

As shown most clearly in FIG. 3C, the side holes 31b and 31d are sealed and are not coupled to the exterior of the optical fiber 16. The side holes 31b and 31d preferably contain air or some other gaseous substance that is relatively compressible.

In operation, a supply of fluid fills the region 47a of the pipe 46 by way of the opening 49. The supply of fluid also fills the region 47b of the pipe 46 that is disposed on the opposite side of the disks 44a and 44b relative to the opening 49. For this purpose, the disks 44a and 44b are provided with a channel 58 that extends through both of the disks 44a and 44b. A similar second channel (not illustrated) that extends through both of the disks 44a and 44b is also provided so as to prevent air from becoming trapped on the opposite side of the disks 44a and 44b. The supply of fluid in the region 47a fills the side hole 31a by way of the channels 50a–50b and the access holes 52a–52b. The supply of fluid in the region 47b fills the side hole 31b by way of the channels 54a–54b and the access holes 56a–56b.

The fluid exerts a pressure on the walls of the side holes 31a and 31c. This pressure is directed radially outwardly from the longitudinal centerline of the side holes 31a and 31c. A portion of the pressure that is directed radially outwardly from the longitudinal centerline of the side holes 31a and 31c is also directed radially inwardly toward the longitudinal centerline of the core 32. This portion of the pressure places a stress on the core and therefore contributes to stress-induced birefringence (even absent any physical deformation). As a result, the birefringence of the optical fiber 16 increases and the spectral separation of the two reflections produced by the fiber grating 36 increases. Moreover, because the side holes 31b and 31d are filled with air or another preferably gaseous material, there is less cladding for the pressure to act upon and a relatively larger portion of the pressure acts on the core. As a result, the extent to which the birefringence increases for a given pressure increase is larger than in an optical fiber without air-filled side holes.

Additionally, another portion of the pressure that is directed radially outwardly from the longitudinal centerline of the side holes 31a and 31c is also directed radially outwardly from the longitudinal centerline of the core 32. This pressure tends to elongate the cross section of the optical fiber 16 in the direction of the line 42a, such that the optical fiber becomes slightly elliptical rather than circular. To the extent that the geometrical asymmetry of the optical fiber 16 increases, the birefringence of the optical fiber 16 increases and the spectral separation of the two reflections produced by the fiber grating 36 increases. Moreover, because the side holes 31b and 31d are filled with air or another preferably gaseous material, it is relatively easier for the optical fiber 16 to deform and acquire an elliptical shape. As a result, for this additional reason, the extent to which the bireflingence increases for a given pressure increase is larger than in an optical fiber without air-filled side holes.

The birefringence of the optical fiber 16 may then be monitored in conventional fashion to determine the pressure of the fluid in the side holes 31a and 31c. When there is no additional birefringence (beyond the inherent birefringence that always biases the optical fiber 16 even absent any pressure), the pressure of the fluid in the side holes 31a and 31c is the same as the pressure of the air in the side holes 31b and 31d. Thus, in the arrangement of FIGS. 3A–3C, the sensor 15 measures the pressure of a fluid with reference to the pressure of a sealed volume of air.

It should be noted that the sensor 15 could be constructed and arranged such that an increase in pressure would tend to decrease (rather than increase) birefringence. In this instance, it may be necessary to utilize a polarization sensitive detection scheme in order to ensure that the two reflections (which each correspond to a different polarization mode) can be adequately distinguished.

It should also be noted that the sensor 15 could be constructed using only two side holes, one of which contains fluid and the other of which contains another material such as air. More than four side holes could also be used.

Finally, it should be noted that instead of filling the side holes 31b and 31d with air, the side holes 31b and 31d could be filled with a temperature compensating material. For example, the side holes 31b and 31d could be filled with the same type of fluid that fills the side holes 31a and 31c. In this instance, as the pressure of the fluid in the side holes 31a and 31c increases due only to an increase in temperature, the pressure of the fluid in the side holes 31b and 31d also increases by a corresponding amount. The pressure in the side holes 31b and 31d acts orthogonally to, and tends to offset, the pressure in the side holes 31a and 31c. The fluid in the side holes 31b and 31d is thus able to achieve temperature compensation for the fluid in the side holes 31a and 31c.

Figure 4:
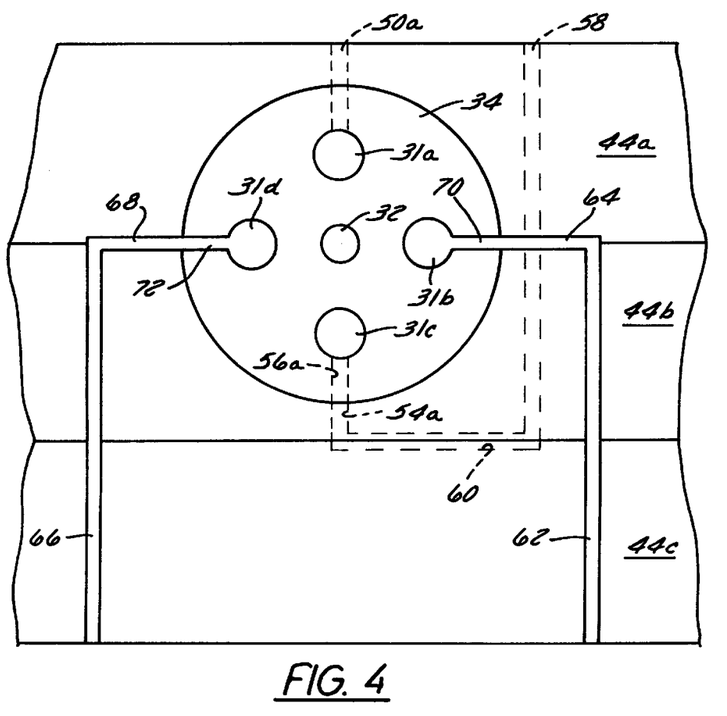
FIG. 4 is a view corresponding to FIG. 3C for an alternative arrangement that uses the birefringent sensor of FIGS. 2A–2B as a differential pressure sensor.

Referring now to FIG. 4, a second preferred arrangement that uses the sensor 15 is illustrated. In the second arrangement, the side holes 31b and 31d are filled with a second fluid, and the sensor 15 measures the differential pressure between the fluid in the side holes 31a and 31c and the fluid in the side holes 31b and 31d.

As shown, the arrangement of FIG. 4 comprises an additional third disk 44c. The third disk 44c isolates the region 47a from the region 47b. Additionally, a channel 60 is formed between the disks 44b and 44c that couples the channel 54a to the channel 58. A similar arrangement is provided for the channel 54b. As a result, the side holes 31a and 31c are filled using only the supply of fluid in the region 47a, and not the supply of fluid in the region 47b.

The side holes 31b and 31d are coupled to the supply of fluid in the region 47b. A second opening (not illustrated) may be formed in the pipe 46 at an opposite end of the pipe as the opening 49 in order to allow the second supply of fluid to fill the region 47b. The side holes 31b and 31d are coupled to the second supply of fluid by way of channels 62, 64 and 66, 68, respectively. Additional access holes 70 and 72 are formed in the cladding that extend from the side holes 31b and 31d to the channels 64 and 68, respectively, at the exterior surface of the optical fiber 16. As in the case of the side holes 31a and 31c (see FIG. 3B), this channel arrangement is provided at both longitudinal ends of the side holes 31b and 31d.

In operation, fluid fills the side holes 31a–31d. The fluid that fills the side hole 31a and the fluid that fills the side hole 31c are from the common supply of fluid in the region 47a. The fluid that fills the side hole 31b and the fluid that fills the side hole 31d are from the common supply of fluid in the region 47b. The fluid in the holes 31a–31d exerts pressure on the walls of the side holes 31a–31d that is directed radially outwardly from the center of each the holes 31a–31d.

Pressure from fluid in the holes 31a and 31c is directed along the line 42a inwardly toward the core as well as outwardly toward the exterior of the optical fiber 16. Pressure from fluid in the holes 31b and 31d is directed along the line 42b inwardly toward the core as well as outwardly toward the exterior of the optical fiber 16. Thus, the pressure from the fluid in the side holes 31b and 31d acts orthogonally to (and tends to offset) the pressure from the fluid in the side holes 31a and 31c. Consequently, the optical fiber 16 becomes more or less birefringent depending on which pressure is larger. Accordingly, the sensor 15 measures the differential pressure between the fluid in the side holes 31a and 31c and the fluid in the side holes 31b and 31d.

Again it should be noted that, while in the preferred embodiment four side holes are used, other numbers of side holes could also be used. For example, only two side holes could be used, one of which is filled with fluid from a first supply of fluid and the other of which is filled with fluid from a second supply of fluid. Alternatively, four side holes could be used, two of which measure differential pressure and the other two of which perform temperature compensation as previously described. Additionally, more than four side holes could also be used.

A number of advantages of the particular preferred embodiment of the sensor should therefore be recognized. First, the sensor exhibits increased sensitivity due to the provision of side holes that are filled with a compressible, deformable material such as air. A smaller amount of pressure or other measured parameter can induce a larger birefringence because the optical fiber is more sensitive to stress (since there is less material for the stress to act upon) and because the optical fiber is more deformable (since there is less material that resists deformation).

Additionally, the sensor is very flexible and can be used in a variety of different applications. The sensor can be used as a pseudo-absolute pressure sensor in which the pressure of a fluid is referenced, for example, against the pressure of a sealed volume of air. The sensor can also be used as a differential pressure sensor in which the difference in pressure between two different fluids is measured. The sensor can also be constructed and arranged so as to have built-in temperature compensation. Finally, the sensor can measure a variety of other parameters besides pressure by placing different materials in the side holes, such as magnetostrictive materials, electro-strictive materials, and thermally expansive materials.

3. Detailed Description of Preferred Detection Circuit

Figure 5:
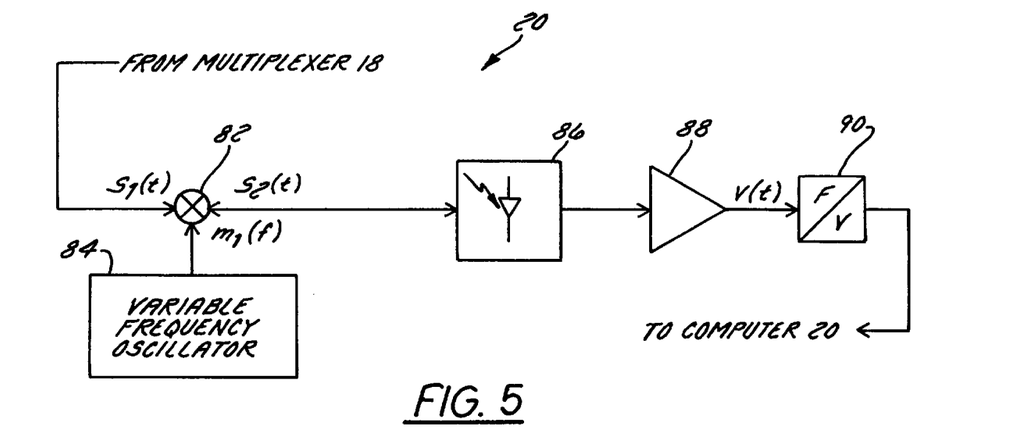
FIG. 5 is a block diagram of a preferred detection circuit for use in conjunction with the birefringent sensor system of FIG. 1.
Figure 6:
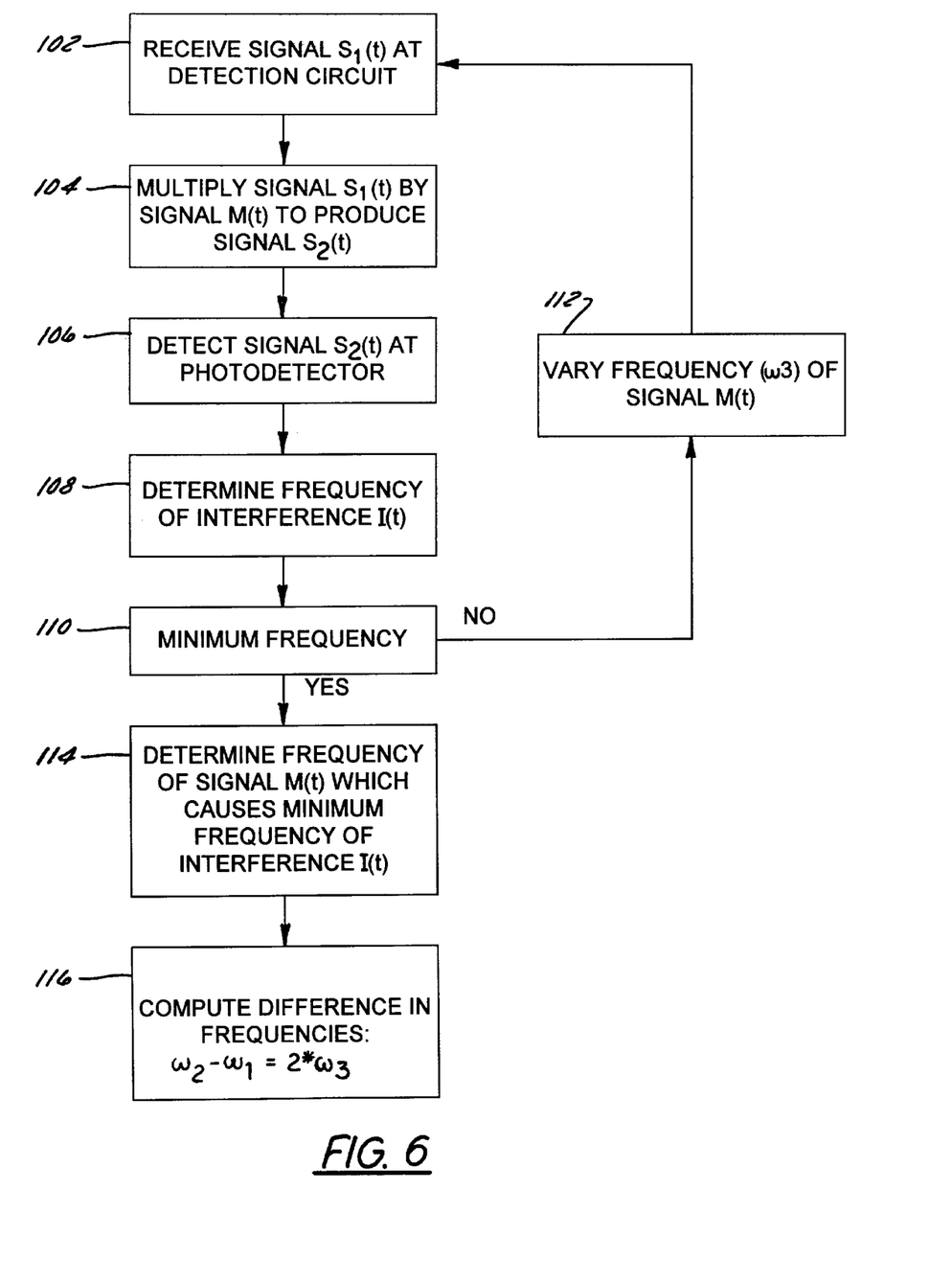
FIG. 6 is a flow chart describing the operation of the detection circuit of FIG. 5.

Referring now to FIGS. 5, 6, and 7A–7D, the detection circuit 20 is described in greater detail. FIG. 5 is a block diagram of the detection circuit 20, FIG. 6 is a flow chart describing the operation of the detection circuit 20, and FIGS. 7A–7D are graphs of signals at various locations in the detection circuit 20.

The purpose of the detection circuit 20 is to determine the difference in wavelength or optical frequency between the two reflections received from the sensor 15. (It is well known that a wavelength λ is related to a corresponding optical frequency ω by the relationship $$\omega = \frac{2\pi c_0}{\lambda n_{\mathit{eff}}},$$

where $c_0$ is the speed of light in a vacuum. In describing the operation of the detection circuit 20, frequency is used instead of wavelength to describe the spectral properties of the signal from the sensor 15.) The frequencies of the two reflections from the sensor 15 are too high for a photodetector to measure the frequencies and determine their difference directly. Therefore, the detection circuit 20 provides a way to determine the frequency difference indirectly.

By way of overview, the operation of the detection circuit is preferably as follows: A technique is used in which the optical signal from the sensor 15 is amplitude modulated with a high frequency electrical modulation signal. The modulation creates additional spectral components (commonly referred to as side bands) in the optical signal. The interference produced using the additional spectral components, which is of a lower frequency, can be monitored using a photodetector. The modulation frequency can be varied in a controlled way in order to minimize the frequency of the interference signal observed at the photodetector. When the frequency of the interference signal is at a minimum, a known relationship exists between the frequency of the modulation signal and the difference in frequency between the two reflections. Therefore, the frequency of the modulation signal can be used to determine the difference in frequency between the two reflections.

$$s_1(t) = A_1 \cdot \cos(\omega_1 \cdot t) + A_2 \cdot \cos(\omega_2 \cdot t) \tag{2}$$

where t is time, $A_1$ is the amplitude of the first reflection, $\omega_1$ is the optical frequency of the first reflection, $A_2$ is the amplitude of the second reflection, and $\omega_2$ is the optical frequency of the second reflection. The Fourier transform of the signal $s_1(t)$ is as follows:

$$s_1(\omega) = A_1 \cdot \pi [\delta(\omega - \omega_1) + \delta(\omega + \omega_1)] + A_2 \cdot \pi [\delta(\omega - \omega_2) + \delta(\omega + \omega_2)] \tag{3}$$

Figure 7A:
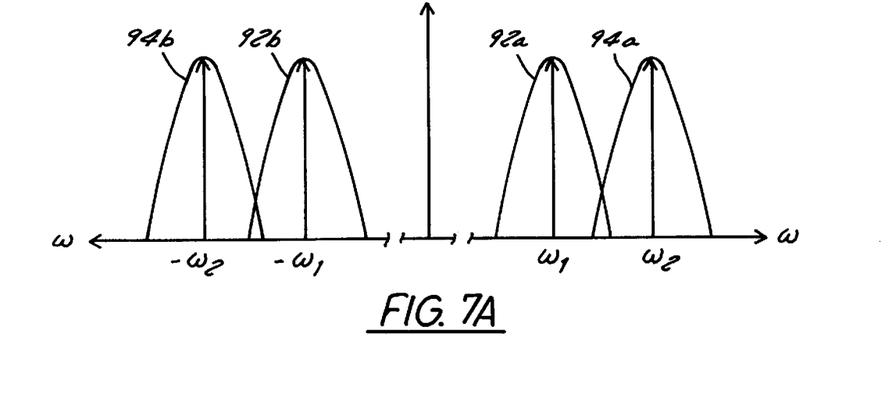
FIGS. 7A–7D are graphs of signals at various locations in the detection circuit of FIG. 5.

FIG. 7A illustrates the corresponding frequency domain representation of the signal $s_1(t)$. As previously noted, the reflections in practice comprise a plurality of narrow-banded spectral components 92a, 92b, 94a and 94b. The spectral components 92a and 92b correspond to one of the reflections and the spectral components 94a and 94b correspond to the other of the reflections. The spectral components 92a and 94a are the positive spectral components and are centered about positive optical frequencies $\omega_1$ and $\omega_2$, respectively. The spectral components 92b and 94b are negative spectral components and correspond to the spectral components 92a and 94a, respectively. The spectral components 92b and 94b are centered about negative optical frequencies $-\omega_1$ and $-\omega_2$, respectively. For clarity purposes, the spectral components 92a–b and 94a–b are modeled in Eqs. (2) and (3) using the dirac delta function (δ) as occurring at discrete optical frequencies $\omega_1$, $-\omega_1$, $\omega_2$ and $-\omega_2$, respectively.

At step 104, the optical modulator 82 multiplies the signal $s_1(t)$ with a modulation signal m(t), thereby producing the amplitude modulated signal $s_2(t)$. The modulation signal $m(t)$ is a high frequency electrical signal. (Of course, the signal $m(t)$ is nevertheless of a lower frequency than the optical signal $s_1(t)$, since electrical signals are always of lower frequency than optical signals.) As described further below, the frequency of the signal $m(t)$ is varied in order to determine the frequency at which the minimum interference frequency occurs. For present purposes, however, it is assumed temporarily that the frequency of the signal $m(t)$ is not varied. In this case, the signal $m(t)$ has the following form:

$$m(t) = A_3 \cdot \cos(\omega_3 \cdot t) \quad (4)$$

where $A_3$ is the amplitude of the signal $m(t)$ and $\omega_3$ is the frequency of the signal $m(t)$. The Fourier transform of the signal $m(t)$ is as follows:

$$m(\omega) = A_3 \cdot \pi[\delta(\omega - \omega_3) + \delta(\omega + \omega_3)] \quad (5)$$

Figure 7B:
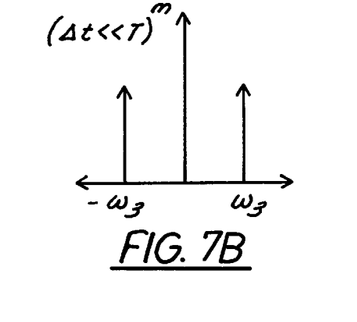

The corresponding frequency domain representation of the signal $m(t)$ is shown in FIG. 7B.

The amplitude modulation (i.e., multiplication) of the signal $m(t)$ with the signal $s_1(t)$ produces a signal $s_2(t)$. The signal $s_2(t)$ has the following form:

$$s_2(t) = (A_1 \cdot \cos(\omega_1 \cdot t) + A_2 \cdot \cos(\omega_2 \cdot t)) \cdot (A_3 \cdot \cos(\omega_3 \cdot t)) \quad (6)$$

The Fourier transform of the signal $s_2(t)$ is as follows:

$$s_2(\omega) = \begin{bmatrix} \frac{1}{2} \cdot A_1 \cdot A_3 \cdot \pi(\delta(\omega - (\omega_1 - \omega_3)) + \delta(\omega - (\omega_1 + \omega_3))) + \\ \frac{1}{2} \cdot A_1 \cdot A_3 \cdot \pi(\delta(\omega + (\omega_1 - \omega_3)) + \delta(\omega + (\omega_1 + \omega_3))) + \\ \frac{1}{2} \cdot A_2 \cdot A_3 \cdot \pi(\delta(\omega - (\omega_2 - \omega_3)) + \delta(\omega - (\omega_2 + \omega_3))) + \\ \frac{1}{2} \cdot A_2 \cdot A_3 \cdot \pi(\delta(\omega + (\omega_2 - \omega_3)) + \delta(\omega + (\omega_2 + \omega_3))) \end{bmatrix} \quad (7)$$

Figure 7C:
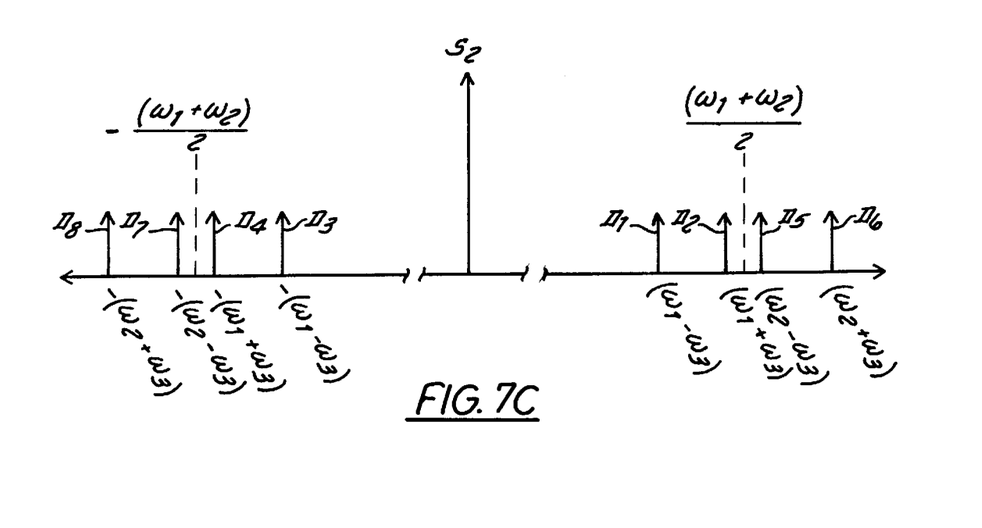
Figure 7D:
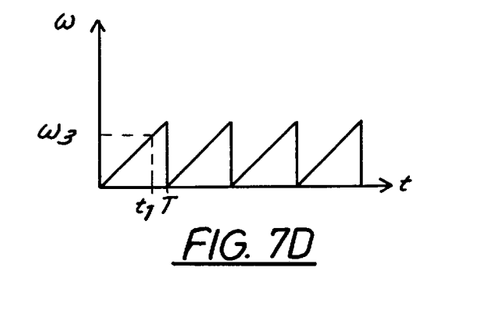

For purposes of simplification, Eq. (7) can be rewritten as follows:

$$s_2(\omega) = \begin{bmatrix} \frac{1}{2} \cdot A_1 \cdot A_3 \cdot \pi[D_1 + D_2] + \\ \frac{1}{2} \cdot A_1 \cdot A_3 \cdot \pi[D_3 + D_4] + \\ \frac{1}{2} \cdot A_2 \cdot A_3 \cdot \pi[D_5 + D_6] + \\ \frac{1}{2} \cdot A_2 \cdot A_3 \cdot \pi[D_7 + D_8] \end{bmatrix} \quad (8)$$

where the terms $D_1$–$D_8$ replace the dirac delta functions of Eq. (7). The corresponding frequency domain representation of the signal $s_2(t)$ is shown in FIG. 7C.

At step 106, the signal $s_2(t)$ is detected at the photodetector 86. When the $D_2$ and $D_5$ components (and therefore the $D_4$ and $D_7$ components) are sufficiently close together, observable interference occurs. The interference has the following form:

$$I(t) = [B_1 \cos[(\omega_1 + \omega_3)t + \theta_1] + B_2 \cos[(\omega_2 - \omega_3)t + \theta_2]]^2 \quad (9)$$

where $\theta_1$ and $\theta_2$ are the st phases and $B_1$ and $B_2$ are constants. The constants $B_1$ and $B_2$ are both functions of the constants $A_1$, $A_2$ and $A_3$ (where $B_1 = \frac{1}{2} A_1 A_3$, $B_2 = \frac{1}{2} A_2 A_3$). (The particular value of the constants $A_1$, $A_2$ and $A_3$ does not matter so long as the interference is of sufficient magnitude to be measurable.) Equation (9) does not incorporate the terms $D_1$, $D_3$, $D_5$ and $D_8$ since these terms do not produce observable interference. Equation (9) can be rewritten as follows:

$$I(t) = \begin{bmatrix} \frac{1}{2}(B_1^2 + B_2^2) + \frac{1}{2}[B_2^2 \cos[2(\omega_2 - \omega_3)t + \theta_2] + \\ B_1^2 \cos[2(\omega_1 + \omega_3)t + \theta_1]] + \\ B_1 B_2 \cos[((\omega_2 - \omega_3) + (\omega_1 + \omega_3))t + (\theta_2 + \theta_1)] + \\ B_1 B_2 \cos[((\omega_2 - \omega_3) - (\omega_1 + \omega_3))t + (\theta_2 - \theta_1)] \end{bmatrix} \quad (10)$$

The output of the photodetector 86 cannot respond to the components at the frequencies $2(\omega_2 - \omega_3)$, $2(\omega_1 + \omega_3)$, $((\omega_2 - \omega_3) + (\omega_1 + \omega_3))$. Therefore, only the first and fourth terms of Eq.(10) are observable by the photodetector 86, and the interference that is observed has the following form:

$$I(t) = \frac{1}{2}(B_1^2 + B_2^2) + B_1 B_2 \cos[((\omega_2 - \omega_3) - (\omega_1 + \omega_3))t + (\theta_2 - \theta_1)] \quad (11)$$

Equation (11) may be simplified by reorganizing the frequency terms and by again replacing the constants $B_1$ and $B_2$ with new constants $C_1$ and $C_2$ (where $C_1 = \frac{1}{2}(B_1^2 + B_2^2)$, $C_2 = B_1 \cdot B_2$).

$$I(t) = C_1 + C_2 \cos[((\omega_2 - \omega_1) - 2\omega_3)t + (\theta_2 - \theta_1)] \quad (12)$$

The $C_1$ term is a DC term that is independent of the frequency $\omega_3$. The $C_2 \cos[((\omega_2 - \omega_1) - 2\omega_3)t + (\theta_2 - \theta_1)]$ term has a frequency that varies according to the term $((\omega_2 - \omega_1) - 2\omega_3)$. The frequency of this term is therefore equal to zero when the term $((\omega_2 - \omega_1) - 2\omega_3)$ is equal to zero, that is, when the following condition is met:

$$\omega_3 = \frac{\omega_2 - \omega_1}{2} \quad (13)$$

Based on Eq. (13), the difference between the frequencies $\omega_1$ and $\omega_2$ may be determined in steps 108–116 in the following manner. In step 108, the frequency of the interference observed by the photodetector 86 is determined. At step 110, it is determined whether the observed frequency is a minimum interference frequency. Since the frequency of the modulation signal $m(t)$ is continuously varied in the manner shown in FIG. 7D (step 112), the frequency of the interference signal experiences a periodic minimum value. Thus, at step 110, the output of the photodetector 86 is continuously monitored as the frequency $\omega_3$ is varied in order to identify the instant at which the frequency of the interference is minimized. The monitoring may be performed by the signal processing unit 22, which is coupled to the photodetector 86 by way of an amplifier 88 and a frequency to voltage converter 90.

At step 114, the value of the modulation frequency $\omega_3$ that causes the minimum frequency of the interference is determined. The relationship between (1) the modulation frequency $\omega_3$ and (2) the difference between the optical frequencies $\omega_1$ and $\omega_2$ is known and is given by Eq. (13). Therefore, at step 116, the difference between the optical frequencies $\omega_1$ and $\omega_2$ may be determined by determining the modulation frequency $\omega_3$ at which the frequency of the interference is minimized and applying Eq. (13).

It may be noted that Eq. (13) assumes that the interference frequency is equal to zero whereas in step 110 a search is performed for the minimum frequency. Conceivably, the search could determine a value of the modulation frequency $\omega_3$ at which the frequency of the interference is equal to zero. In practice, however, it ordinarily will not be possible to determine the precise frequency that causes the interference frequency to be equal to zero, especially since the signal $s_1(t)$ produced by the sensor 15 may not have a completely constant frequency. Therefore, the difference between the optical frequencies $\omega_1$ and $\omega_2$ is determined on the basis of the modulation frequency $\omega_3$ at which the frequency of the interference is at a minimum, as opposed to the modulation frequency $\omega_3$ at which the frequency of the interference is equal to zero. To the extent that the frequency of the interference is non-zero, this simply represents a slight error in the measurement.

It should also be noted that, although the detection circuit 20 is preferably used in conjunction with the sensor 15 described above, the detection circuit could also be used with other types of devices. For example, the detection circuit 20 in conjunction with birefringent grating sensors could also be used for performing multi-axial strain measurements. In general, the detection circuit 20 could be used in conjunction with any sensor or other device in which a signal is produced at two frequencies and in which it is desired to determine the difference between the two frequencies, regardless of the physical construction of the device.

It should also be noted that the two positive (and two negative) spectral components are in orthogonal polarization states, and therefore are easily separable using, for example, a polarization-dependent beam splitter or a polarization splitting coupler which may be placed at the input of the detection circuit 20. This allows the optical fiber that carries the signal from the sensor 15 to be split into two optical paths, each of which carries one of the two spectral components. Further, this allows the two spectral components to be manipulated independently, for example, by multiplying them by different modulation signals having different modulation frequencies. However, this also requires that the polarization states of the two spectral components be matched. This could be accomplished, for example, using a half-wave plate (when using a polarization-dependent beam splitter) or by properly orienting the two optical fibers about the polarization axis (when using the polarization splitting coupler).

It should also be noted that while in the preferred embodiment heterodyne detection is used (in which the optical signal $s_1(t)$ is mixed with another signal m(t)), homodyne detection could also be used. In this case, the optical signal $s_1(t)$ is mixed with itself in order to produce a lower frequency component. The lower frequency component of the signal $s_1(t)$ may then be caused to interfere a variable frequency modulation signal m(t) as previously described.

Figure 8:
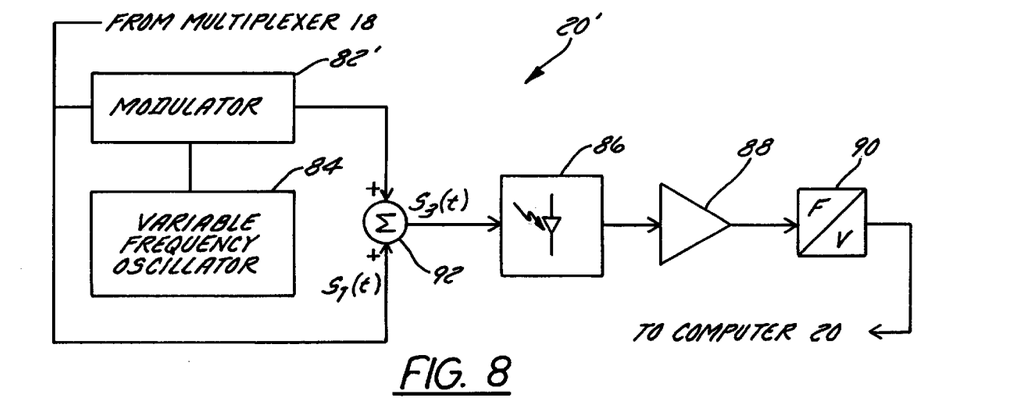
FIG. 8 is a block diagram of an alternative detection circuit usable in conjunction with the birefringent sensor system of FIG. 1.
Figure 9:
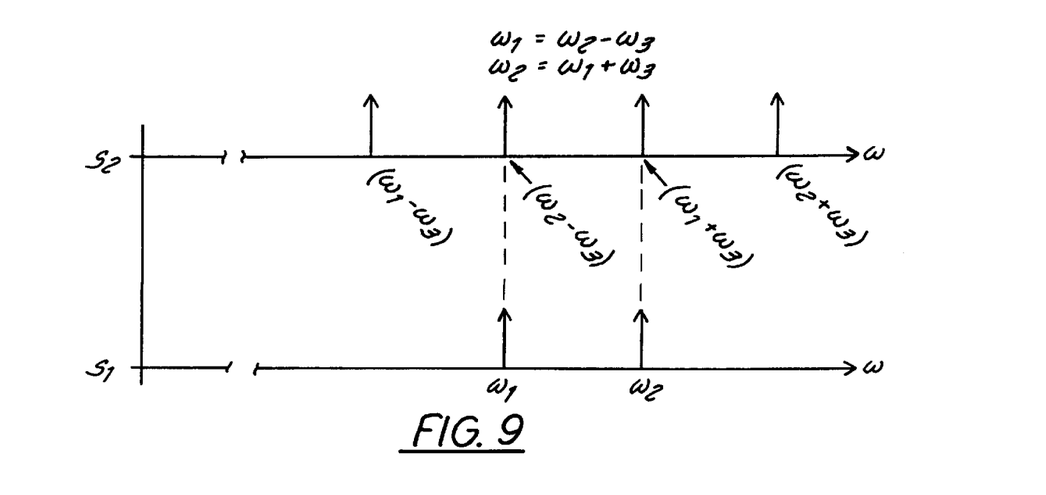
FIG. 9 is a frequency domain graph showing the components of interference produced in the detection system of FIG. 8.

Referring now to FIGS. 8–9, an alternative embodiment of the detection circuit 20 is illustrated. FIG. 8 corresponds to FIG. 5 and indicates the differences between the detection circuit 20 and a modified detection circuit 20'. In the detection circuit 20' a summing junction 92 is disposed between a modulator 82' and the photodetector 86. Instead of being an amplitude modulator as in FIG. 1, the modulator 82' could instead be a phase modulator. Additionally, a frequency modulator or polarization modulator could also be used. For purposes of describing the invention, it is now assumed that the modulator 82' is an amplitude modulator.

The summing junction 92 receives the optical signal $s_1(t)$ directly from the multiplexer 18. Of course, the output $s_3(t)$ of the summing junction 92 is the summation of the optical signals $s_1(t)$ and $s_2(t)$. The Fourier transforms of the optical signals $s_1(t)$ and $s_2(t)$ are given in Eqs. (3) and (7), respectively.

FIG. 9 corresponds to FIG. 7C and shows a frequency domain representation of the signals $s_1(t)$ and $s_2(t)$ which are both detected by the photodetector 86. (For simplicity, only the positive spectral components of the signals $s_1(t)$ and $s_2(t)$ are shown in FIG. 9.) As apparent from FIG. 9, observable interference between the signals $s_1(t)$ and $s_2(t)$ occurs (1) between the $\omega_1$ component of the signal $s_1(t)$ and the $\omega_2-\omega_3$ component of the signal $s_2(t)$, and (2) between the $\omega_2$ component of the signal $s_1(t)$ and the $\omega_1+\omega_3$ component of the signal $s_2(t)$. The frequency of the interference will be the same in both instances and will be equal to zero when $\omega_1=\omega_2-\omega_3$ and $\omega_2=\omega_1+\omega_3$ or, alternatively stated, when the following condition is met:

$$\omega_3=\omega_2-\omega_1 \tag{14}$$

Therefore, the difference in optical frequencies between the optical signals $s_1(t)$ and $s_2(t)$ may be determined by performing the process described in FIG. 6 in conjunction with Eq. (14).

It should be noted that the system of FIG. 5 is preferred over the system of FIG. 8 because the frequency $\omega_3$ of the high frequency electrical modulation signal m(t) need only be half as high in the system of FIG. 5 in order to minimize the interference frequency. This is apparent from a comparison of Eqs. (13) and (14). In practice, it is significantly easier to generate a frequency $\omega_3$ that satisfies the condition of Eq. (13) as compared to a frequency $\omega_3$ that satisfies the condition of Eq. (14).

Advantageously, the detection system according to the present invention may be constructed using entirely solid state optics/electronics, an interferometer implemented using free space optics is not required. This permits the detection system to be constructed less expensively, more compactly, and in a manner that is more resistant to vibration as compared to existing detection systems. These benefits are achieved without any loss in precision as compared to existing detection systems.

Many other changes and modifications may be made to the present invention without departing from the spirit thereof. The scope of these and other changes will become apparent from the appended claims.

We claim:

1. A method of detecting a difference in frequency between optical first and second narrow-banded positive spectral components of an optical signal, the first and second spectral components being respectively centered about first and second frequencies, the method comprising the steps of:

(A) modulating at least one of the first and second spectral components of the optical signal by a narrow-banded positive modulation spectral component of a modulation signal, the modulation spectral component being centered at a given instant about a modulation frequency;

(B) producing an interference signal that has an interference frequency which is a function of the first and second frequencies and the modulation frequency;

(C) varying the modulation frequency, the variation of the modulation frequency causing the interference frequency to vary;

(D) monitoring the variation of the interference frequency; and (E) determining the difference in frequency between first and second spectral components based on the monitoring step (D).

2. A method as defined in claim 1 wherein, during the modulating step (A), the at least one of the first and second spectral components of the optical signal is amplitude modulated by the narrow-banded positive modulation spectral component of the modulation signal.

3. A method as defined in claim 1 wherein, during the modulating step (A), the at least one of the first and second spectral components of the optical signal is phase modulated by the narrow-banded positive modulation spectral component of the modulation signal.

4. A method as defined in claim 1 wherein, during the modulating step (A), the at least one of the first and second spectral components of the optical signal is polarization modulated by the narrow-banded positive modulation spectral component of the modulation signal.

5. A method as defined in claim 1, wherein the monitoring step (D) comprises the step of searching for a value of the modulation frequency that minimizes the interference frequency.

6. A method as defined in claim 5 wherein, during the modulating step (A), both of the first and second spectral components, of the optical signal are modulated by the modulation spectral component of the modulation signal.

7. A method as defined in claim 6, wherein the determining step (E) comprises dividing the value of the modulation frequency that minimizes the interference frequency by two, the quotient of the division equaling the difference in frequency between the first and second spectral components.

8. A method as defined in claim 1,
wherein the modulation spectral component is a first modulation spectral component and the modulation frequency is a first modulation frequency; and
wherein, during the modulating step (A), the first spectral component of the optical signal is modulated with the first modulation spectral component and the second spectral component is modulated with a second modulation spectral component that is centered about a second modulation frequency, the second modulation frequency being different than the first modulation frequency.

9. A method as defined in claim 1 wherein, during the modulating step (A), only one of the first and second spectral components of the optical signal is modulated.

10. A method as defined in claim 1, further comprising the step of receiving the optical signal from a birefringent device.

11. A method as defined in claim 1, further comprising the step of receiving the optical signal from a birefringent sensor formed of a fiber grating that is recorded in an optical fiber, the fiber grating being generally transmissive but being reflective in first and second positive narrow-banded spectral regions, the first and second spectral regions being respectively centered about the first and second frequencies, the spectral separation between the first and second frequencies varying in accordance with a parameter sensed by the birefringent sensor, the birefringent sensor being coupled to the light source and receiving light therefrom, the birefringent sensor reflecting a portion of the light so as to produce a first optical signal having first and second narrow-banded positive spectral components that correspond to the first and second reflective regions of the fiber grating and that are respectively centered about the first and second frequencies, the optical fiber having a cladding and a core, the cladding having first and second side holes formed therein that extend substantially parallel to the core, the first and second side holes being substantially coextensively located with respect to each other along the length of the optical fiber, and the first and second side holes being positioned such that, in the transverse cross section of the optical fiber, a first radial line that extends from the core to the first side hole is substantially perpendicular to a second radial line that extends from the core to the second side hole.

12. A sensor system comprising:
(A) a broadband light source;
(B) a birefringent sensor, the birefringent sensor being formed of a fiber grating that is recorded in an optical fiber, the fiber grating being generally transmissive but being reflective in first and second positive narrow-banded spectral regions, the first and second spectral regions being respectively centered about optical first and second frequencies, the spectral separation between the first and second frequencies varying in accordance with a parameter sensed by the birefringent sensor, the birefringent sensor being coupled to the light source and receiving light therefrom, the birefringent sensor reflecting a portion of the light so as to produce a first optical signal having first and second narrow-banded positive spectral components that correspond to the first and second reflective regions of the fiber grating and that are respectively centered about the first and second frequencies;
(C) a detection circuit coupled to the birefringent sensor by way of the optical fiber, the detection circuit further including
(1) a variable frequency oscillator which produces a modulation signal,
(2) a modulator coupled to the oscillator, the modulator receiving the optical signal from the birefringent sensor and the modulation signal from the variable frequency oscillator, and the modulator modulating at least one of the first and second spectral components of the optical signal using the modulation signal, and
(3) a photodetector coupled to the modulator, the photodetector detecting an interference signal having an interference frequency; and
(D) a signal processing unit coupled to the detection circuit, the signal processing unit determining the difference in frequency between first and second spectral components based on the interference frequency of the interference signal.

13. A sensor system as defined in claim 12, wherein the signal processing unit searches for a value of the modulation frequency that causes a minimum value for the interference frequency.

14. A sensor system as defined in claim 13, wherein the modulator modulates both of the first and second spectral components of the optical signal by the modulation spectral component of the modulation signal.

15. A sensor system as defined in claim 14, wherein the signal processing unit determines the difference in frequency between the first and second spectral components by dividing the value of the modulation frequency that causes the minimum value for the interference frequency by two, the quotient of the division equaling the difference in frequency between the first and second spectral components.

16. A sensor system as defined in claim 12, wherein the signal processing unit is coupled to the photodetector by way of a frequency to voltage converter, the frequency to voltage converter having an output signal that is indicative of the frequency of the interference signal.

17. A sensor system as defined in claim 12, wherein the photodetector is coupled to the modulator by way of a summing junction, the summing junction having a first input coupled to the modulator, a second input that receives the optical signal, and an output that is coupled to the photodetector.

18. A sensor system as defined in claim 12, wherein the detection circuit is coupled to the birefringent sensor by way of a multiplexer, and wherein the system further comprises a plurality of additional birefringent sensors, the plurality of additional birefringent sensors being coupled to the broadband light source by way of the optical fiber and being coupled to the detection circuit by way of the optical fiber and the multiplexer;

the multiplexer, including a first data input that is coupled to the birefringent sensor and to the plurality of additional birefringent sensors, a second select input that is coupled to the signal processing unit and that is used to select among the birefringent sensor and the plurality of additional birefringent sensors, and an output that is coupled to the detection circuit and that contains data from a selected one of the sensors.

19. A sensor system as defined in claim 12, wherein the optical fiber has a cladding and a core, the cladding having first and second side holes formed therein that extend substantially parallel to the core, the first and second side holes being substantially coextensively located with respect to each other along the length of the optical fiber, and the first and second side holes being positioned such that, in the transverse cross section of the optical fiber, a first radial line that extends from the core to the first side hole is non-parallel and non-coincident with a second radial line that extends from the core to the second side hole.

20. A method of detecting a difference in frequency comprising the steps of:

(A) receiving an optical signal from a birefringent sensor, the optical signal having first and second narrow-banded positive spectral components that are respectively centered about first and second optical frequencies, the difference in frequency between the first and second frequencies varying in accordance with a parameter sensed by the birefringent sensor;

(B) modulating at least the first spectral component of the optical signal by a narrow-banded positive modulation spectral component of a modulation signal, the modulation spectral component being centered about a modulation frequency, the modulation shifting first and second portions of the first spectral component to locations that are respectively centered about the sum and difference of the first frequency and the modulation frequency;

(C) producing an interference signal that has an interference frequency that is a function of the first and second frequencies and the modulation frequency, the interference signal being produced by interference between (1) one of the first and second portions of the first spectral component and (2) at least a portion of the second spectral component;

(D) varying the modulation frequency, the variation of the modulation frequency causing the interference frequency to vary;

(E) monitoring the interference signal to determine when (1) the one of the first and second portions of the first spectral component is centered around substantially the same frequency as (2) the portion of the second spectral component; and (F) determining the difference in frequency between first and second spectral components based on a value of the modulation frequency when (1) the one of the first and second portions of the first spectral component is centered around substantially the same frequency as (2) the portion of the second spectral component.

21. A method as defined in claim 20 wherein, during the modulating step (B), the modulation shifts first and second portions of the second spectral component to locations that are respectively centered about the sum and difference of the second frequency and the modulation frequency; and wherein, during the producing step (C), the interference signal is produced by interference between (1) the one of the first and second portions of the first spectral component and (2) the other one of the first and second portions of the second spectral component.

22. A method as defined in claim 21 wherein, during the producing step (C), the interference signal is produced by interference between (1) the one of the first and second portions of the first spectral component and (2) a portion of the second spectral component that is centered about the second frequency.

* * * * *